(12) United States Patent
Lee et al.

(10) Patent No.: US 10,474,198 B2
(45) Date of Patent: Nov. 12, 2019

(54) ROLLABLE FLEXIBLE DISPLAY

(71) Applicant: LG Display Co., Ltd., Seoul (KR)

(72) Inventors: Youngshin Lee, Paju-si (KR); Bongchul Kim, Daegu (KR); Junhyeok Yang, Jeju-si (KR); Sangyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/294,833

(22) Filed: Mar. 6, 2019

(65) Prior Publication Data
US 2019/0204875 A1 Jul. 4, 2019

Related U.S. Application Data

(63) Continuation of application No. 15/499,762, filed on Apr. 27, 2017, now Pat. No. 10,254,797.

(30) Foreign Application Priority Data

Apr. 29, 2016 (KR) .................. 10-2016-0053566

(51) Int. Cl.
G06F 1/16 (2006.01)
H01L 51/00 (2006.01)
(Continued)

(52) U.S. Cl.
CPC ......... *G06F 1/1652* (2013.01); *G09G 3/3233* (2013.01); *H01L 27/3276* (2013.01); *H01L 51/0097* (2013.01); *H01L 51/5237* (2013.01); *H05K 5/0217* (2013.01); *G06F 1/1613* (2013.01); *G09G 2300/0842* (2013.01); *G09G 2310/0251* (2013.01); *H01L 27/3213* (2013.01);
(Continued)

(58) Field of Classification Search
CPC .................................................. H05K 5/0226
See application file for complete search history.

(56) References Cited

U.S. PATENT DOCUMENTS 9,098,241 B1 8/2015 Cho et al.
9,508,585 B2 11/2016 Mao
(Continued)

FOREIGN PATENT DOCUMENTS

CN 100578836 C 1/2010
CN 103456689 A 12/2013
(Continued)

OTHER PUBLICATIONS

First Office Action, Chinese Patent Application No. 201710293264. 4, dated Dec. 26, 2018, 14 pages.
(Continued)

*Primary Examiner* — Christopher E Mahoney
(74) *Attorney, Agent, or Firm* — Fenwick & West LLP

(57) ABSTRACT

A rollable flexible display comprises: a display panel on which signal lines and pixels are arranged; a control board that supplies the signal lines with signals to drive the pixels; and a panel roller portion around which the display panel is rolled up and including an inner space for placing the control board, wherein the transverse width of the control board is greater than the inner diameter of the panel roller portion, and an insert portion for insertion into a slot in the panel roller portion is provided on at least one edge of the control board.

18 Claims, 15 Drawing Sheets

(51) Int. Cl.
*H01L 51/52* (2006.01)
*G09G 3/3233* (2016.01)
*H05K 5/02* (2006.01)
*H01L 27/32* (2006.01)

(52) U.S. Cl.
CPC ..... *H01L 2251/5338* (2013.01); *Y02E 10/549* (2013.01)

(56) References Cited

U.S. PATENT DOCUMENTS

| | | | |
|---|---|---|---|
| 9,625,946 | B2 | 4/2017 | Lee et al. |
| 9,905,577 | B2 | 2/2018 | Qin et al. |
| 2006/0109413 | A1 | 5/2006 | Lee |
| 2008/0049003 | A1* | 2/2008 | Hasegawa ............. G06F 1/1615 345/206 |
| 2009/0174317 | A1* | 7/2009 | Jung .................... G02B 5/3025 313/504 |
| 2014/0362512 | A1 | 12/2014 | Hinson |
| 2016/0118286 | A1 | 4/2016 | Mao |
| 2016/0140888 | A1* | 5/2016 | Lee ......................... G09G 3/20 345/698 |
| 2016/0163241 | A1* | 6/2016 | Lee ......................... G09F 9/301 40/584 |
| 2016/0239050 | A1 | 8/2016 | Kim et al. |
| 2016/0268313 | A1 | 9/2016 | Qin et al. |
| 2016/0358806 | A1 | 12/2016 | Mao |
| 2017/0031388 | A1 | 2/2017 | Han et al. |
| 2017/0060183 | A1 | 3/2017 | Zhang et al. |
| 2017/0156225 | A1 | 6/2017 | Heo et al. |
| 2017/0199103 | A1 | 7/2017 | Konakai et al. |
| 2017/0302772 | A1* | 10/2017 | Zhang .................... H01L 51/56 |

FOREIGN PATENT DOCUMENTS

| | | |
|---|---|---|
| CN | 103646611 A | 3/2014 |
| WO | WO 2016024742 A1 | 2/2016 |

OTHER PUBLICATIONS

United States Office Action, U.S. Appl. No. 15/499,762, dated Jun. 28, 2018, 8 pages.

* cited by examiner

FIG. 5
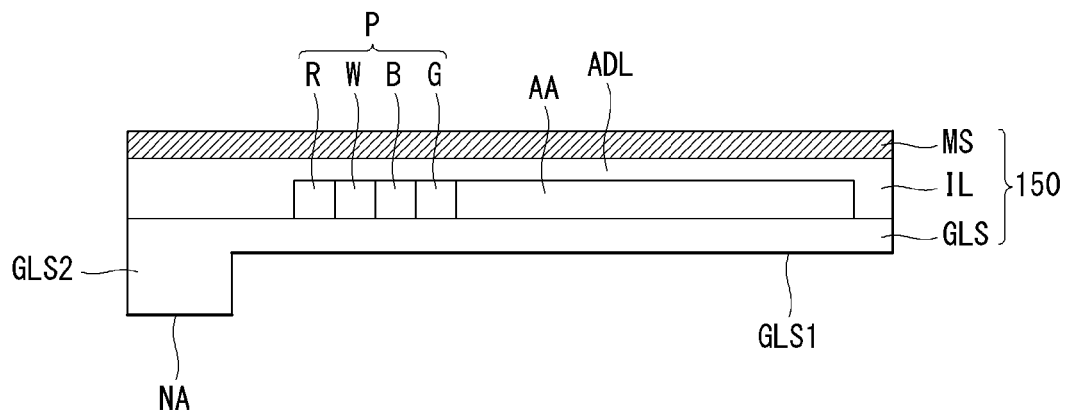
FIG. 6
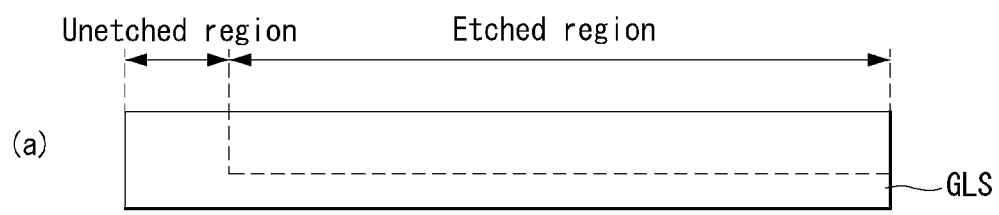
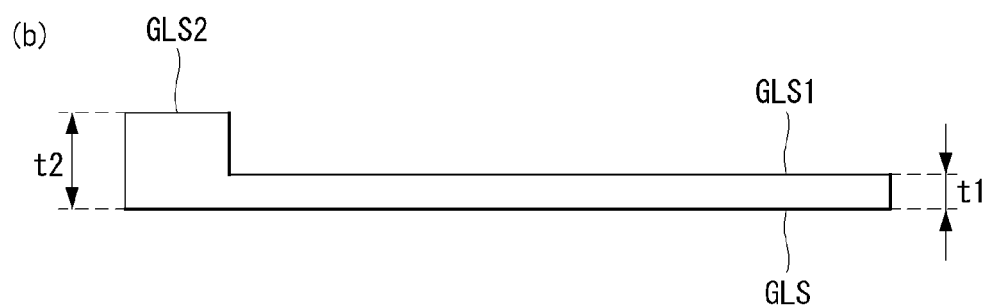

FIG. 9
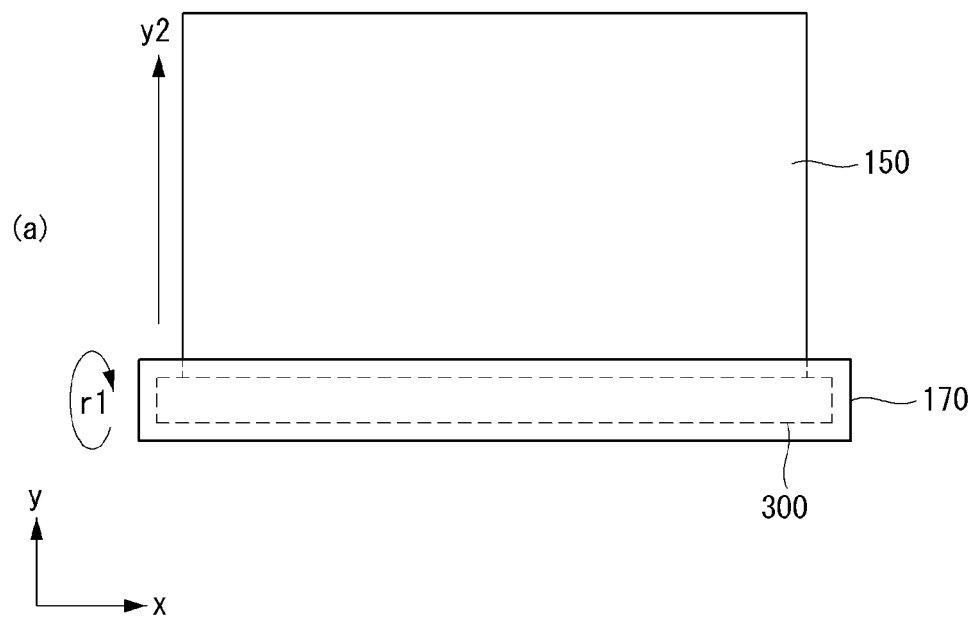
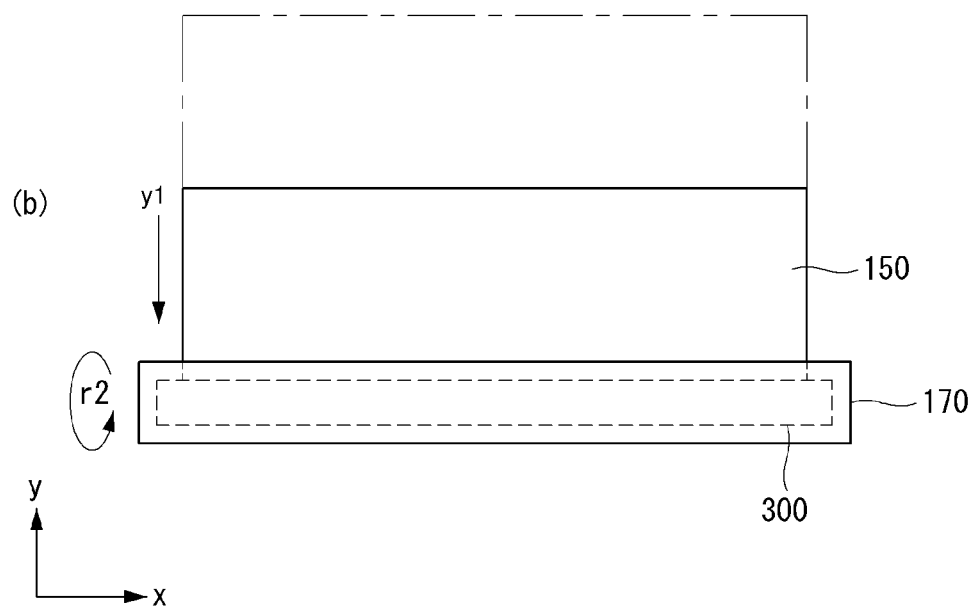

FIG. 11
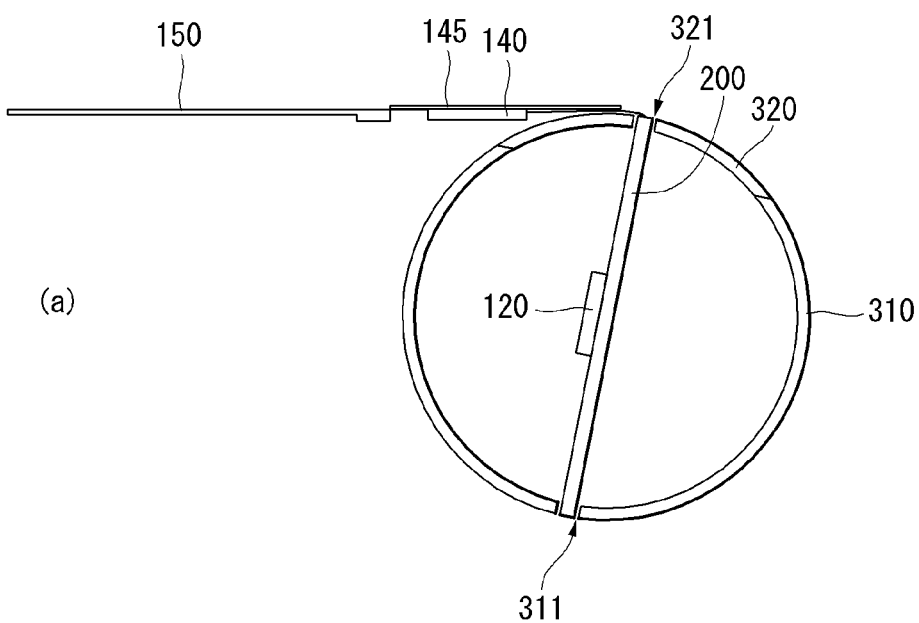
(a)
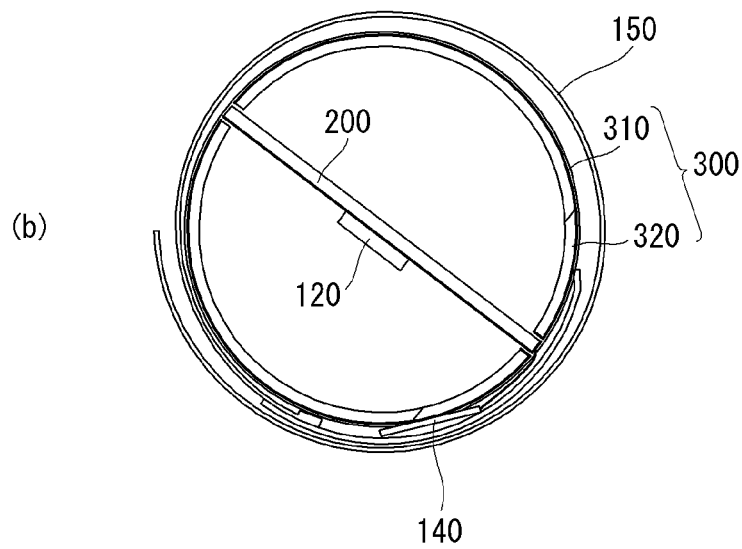
(b)

FIG. 18
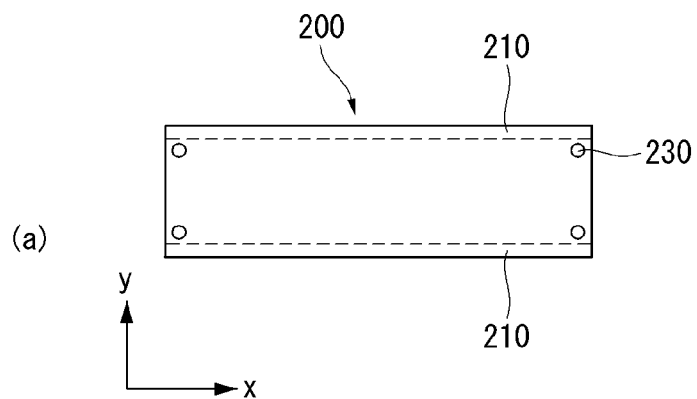
(a)
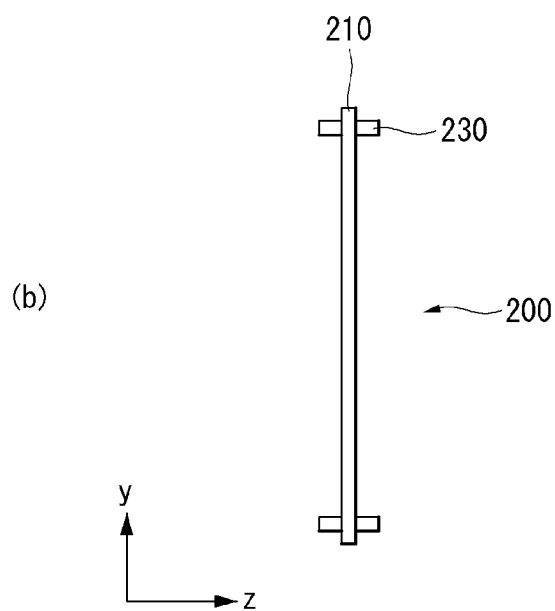
(b)

ROLLABLE FLEXIBLE DISPLAY

CROSS-REFERENCE TO RELATED APPLICATIONS

This application is a continuation of U.S. patent application Ser. No. 15/499,762, filed on Apr. 27, 2017, which claims priority under 35 U.S.C. § 119(a) of Republic of Korea Patent Application No. 10-2016-0053566, filed on Apr. 29, 2016, all of which are hereby incorporated herein by reference in their entirety.

BACKGROUND

Technical Field

The present invention relates to a rollable flexible display.

Discussion of the Related Art

With the development of information technology, the market for displays, which act as an intermediary between users and information, is growing. Thus, display devices such as organic light-emitting displays (OLEDs), liquid crystal displays (LCDs), and plasma display panels (PDPs) are increasingly used.

Among the above-explained display devices, an organic light-emitting display comprises a display panel comprising a plurality of subpixels and a drive part that drives the display panel. The drive part comprises a scan driver that supplies a scan signal (or gate signal) to the display panel, and a data driver that supplies a data signal to the display panel.

Since the organic light-emitting display offers flexibility, the display panel can be bent or curved, and the shape of the display panel can be changed by rolling and unrolling it like a scroll. For this reason, more and more attempts are being made to design the display panel of the organic light-emitting display and a mechanical structure for holding the display panel in various shapes.

Notably, rollable flexible displays with a display panel that can be rolled up can be applied to portable or display devices owing to the reduction in size. Thus, there are attempts to develop holding structures for maximizing the advantages of the rollable flexible displays.

SUMMARY

The present disclosure provides a rollable flexible display comprising: a display panel on which signal lines and pixels are arranged; a control board that supplies the signal lines with signals to drive the pixels; and a panel roller portion around which the display panel is rolled up that has an inner space for placing the control board, wherein the transverse width of the control board is greater than the inner diameter of the panel roller portion, and an insert portion for insertion into a slot in the panel roller portion is provided on at least one edge of the control board.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of the invention. In the drawings:

FIG. 5 illustrates a cross-section of a display panel according to an embodiment.

FIG. 6 is a cross-sectional view showing an example of etching a first substrate according to an embodiment.

FIG. 9 is a view showing a rollable flexible display according to an embodiment.

FIG. 11 shows a display panel when spread out from the panel roller portion and when rolled up around the panel roller portion according to an embodiment.

FIG. 18 is a view of the control board according to an embodiment.

DETAILED DESCRIPTION

Hereinafter, concrete details for carrying out embodiments of the present invention will be described with reference to the accompanying drawings.

An example of implementation of a rollable flexible display according to an embodiment will be described below with respect to an organic light-emitting display. However, a display panel for implementing the rollable flexible display is not limited to this example.

Figure 1:
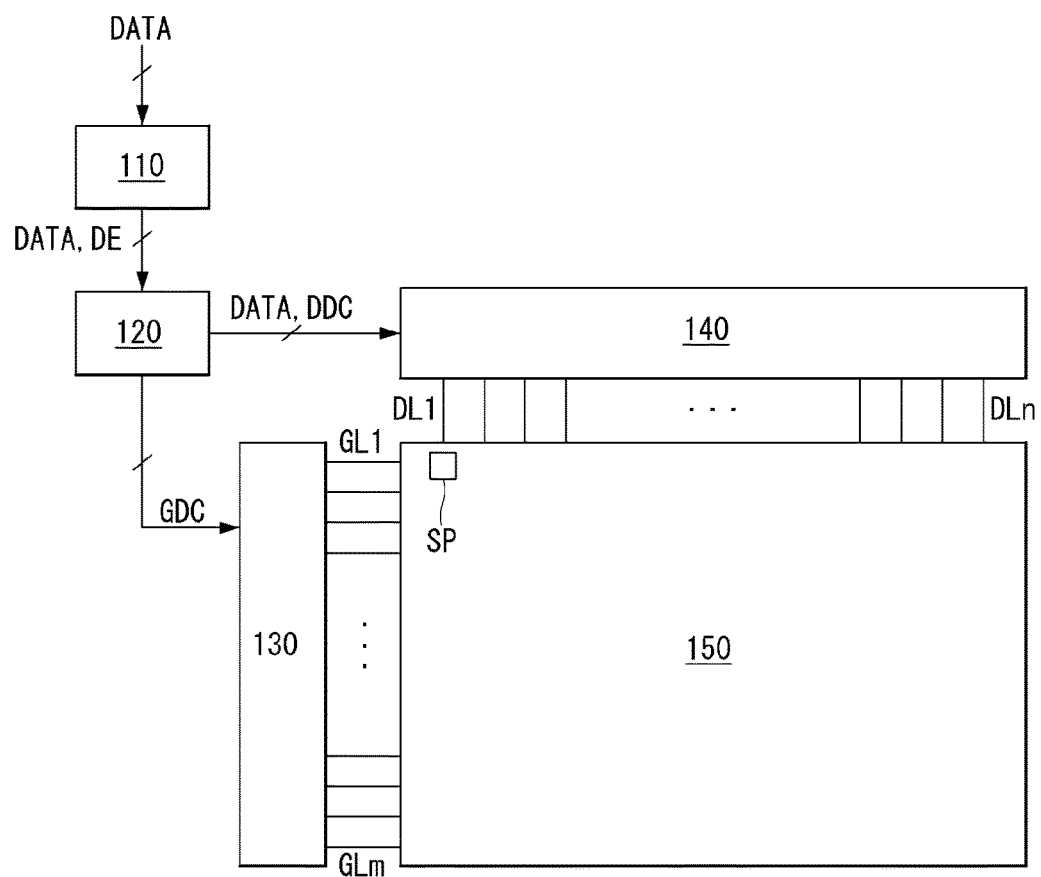
FIG. 1 is a schematic block diagram of an organic light-emitting display according to an embodiment.
Figure 2:
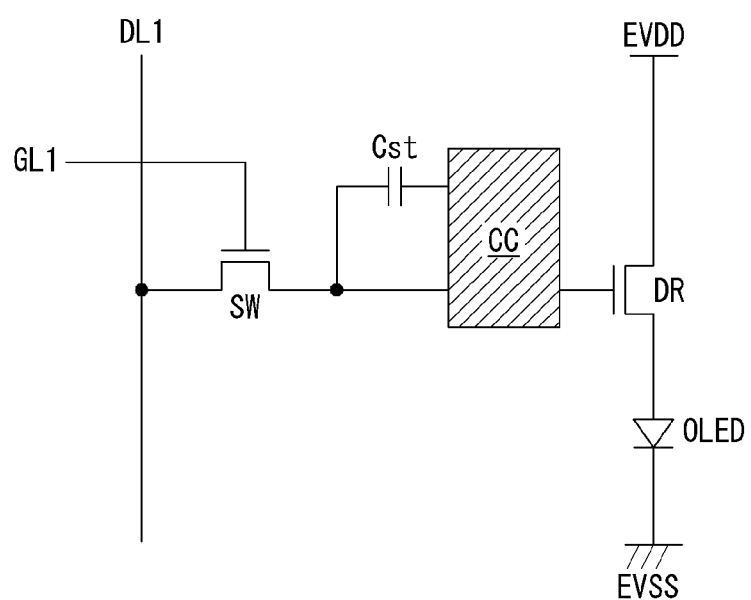
FIG. 2 is a schematic view showing the circuit configuration of a subpixel according to an embodiment.
Figure 3:
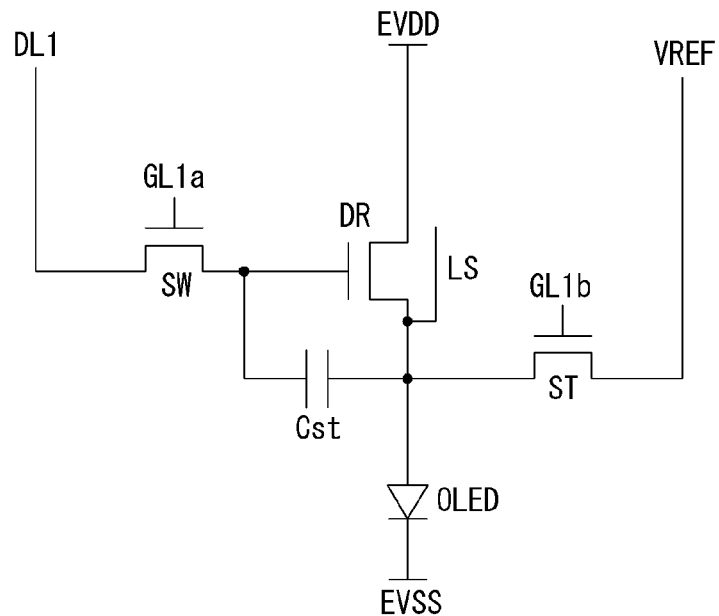
FIG. 3 illustrates an example of the configuration of a subpixel according to an embodiment.

FIG. 1 is a schematic block diagram of an organic light-emitting display according to an embodiment. FIG. 2 is a schematic view showing the circuit configuration of a subpixel according to an embodiment. FIG. 3 illustrates an example of the configuration of a subpixel according to an embodiment.

As illustrated in FIG. 1, an organic light-emitting display according to an embodiment comprises an image processor 110, a timing controller 120, a data driver 140, a scan driver 130, and a display panel 150.

The image processor 110 outputs a data enable signal DE, etc., along with a data signal DATA supplied from the outside. In addition to the data enable signal DE, the image processor 110 may output one or more of a vertical synchronization signal, a horizontal synchronization signal, and a clock signal. But, these signals are omitted in the drawings for convenience of explanation.

The timing controller 120 receives the data signal DATA, along with the data enable signal DE or driving signals including a vertical synchronization signal, horizontal synchronization signal, and clock signal, from the image processor 110. The timing controller 120 outputs a gate timing control signal GDC for controlling the operation timing of the scan driver 130 and a data timing control signal DDC for controlling the operation timing of the data driver 140, based on a driving signal.

The data driver 140 samples and latches the data signal DATA supplied from the timing controller 120, in response to the data timing control signal DDC supplied from the timing controller 120, and converts this signal to a gamma reference voltage and outputs it. The data driver 140 outputs the data signal DATA through data lines DL1 to DLn. The data driver 140 may be formed in the form of an IC (integrated circuit).

The scan driver 130 outputs a scan signal while shifting the level of a gate voltage, in response to the gate timing control signal GDC supplied from the timing controller 120. The scan driver 130 outputs a scan signal through scan lines GL1 to GLm. The scan driver 130 is formed in the form of an IC (integrated circuit), or formed on the display panel 150 in the form of a Gate-In-panel.

The display panel 150 displays an image in response to the data signal DATA and scan signal supplied from the data driver 140 and scan driver 130, respectively. The display panel 150 comprises subpixels SP that work to display an image.

The subpixels SP may be top-emission type, bottom-emission type, or dual-emission type according to their structure. The subpixels SP may comprise red subpixels, green subpixels, and blue subpixels, or may comprise white subpixels, red subpixels, green subpixels, and blue subpixels. The subpixels SP may have one or more different light-emission areas depending on the light-emission characteristics.

As illustrated in FIG. 2, one subpixel comprises a switching transistor SW, a driving transistor DR, a capacitor Cst, a compensation circuit CC, and an organic light-emitting diode OLED.

The switching transistor SW acts as a switch in response to a scan signal supplied through the first scan line GL1 to store a data signal supplied through the first data line DL1 as a data voltage in the capacitor Cst. The driving transistor DR works to cause a drive current to flow between a first power supply line EVDD and a second power supply line EVSS by the data voltage stored in the capacitor Cst. The organic light-emitting diode OLED works to emit light by the drive current formed by the driving transistor DR.

The compensation circuit CC is a circuit that is added within the subpixel to compensate the threshold voltage of the driving transistor DR. The compensation circuit CC consists of one or more transistors. The configuration of the compensation circuit CC may vary depending on the method of compensation, an example of which is described below.

As illustrated in FIG. 3, the compensation circuit CC comprises a sensing transistor ST and a sensing line VREF. The sensing transistor ST is connected between a source line of the driving transistor DR and the anode (hereinafter, sensing node) of the organic light-emitting diode. The sensing transistor ST works to supply a reset voltage (or sensing voltage) passed through the sensing line VREF to the sensing node or to sense the voltage or current at the sensing node.

The switching transistor SW has a first electrode connected to the first data line DL1 and a second electrode connected to a gate electrode of the driving transistor DR. The driving transistor DR has a first electrode connected to the first power supply line EVDD and a second electrode connected to the anode of the organic light-emitting diode OLED. The capacitor Cst has a first electrode connected to the gate electrode of the driving transistor DR and a second electrode connected to the anode of the organic light-emitting diode OLED. The anode and the cathode of the organic light-emitting diode OLED are connected to the second electrode of the driving thin film transistor DR and the second power supply line EVSS, respectively. The sensing transistor ST has a first electrode connected to the sensing line VREF and a second electrode connected to the anode, which is a sensing node, of the organic light-emitting diode OLED. For reference, the first and second electrodes are defined as source and drain electrodes, or drain and source electrodes, depending on the transistor type.

The sensing transistor ST and the switching transistor SW may operate at the same time, close to the same time, or at different times, depending on the compensation algorithm (or the configuration of the compensation circuit CC). In an example, the switching transistor SW may have a gate electrode connected to a 1a-th scan line GL1a, and the sensing transistor ST may have a gate electrode connected to a 1b-th scan line GL1b. In another example, the 1a-th scan line GL1a connected to the gate electrode of the switching transistor SW and the 1b-th scan line GL1b connected to the gate electrode of the sensing transistor ST may be connected in such a way as to be commonly shared.

The sensing line VREF may be connected to the data driver 140. In this case, the data driver 140 may sense the sensing node of the subpixel and perform a compensation operation according to the sensing result, in real time, during a non-display period of an image, or during an N-frame period (N is an integer equal to or greater than 1). In a different example, the switching transistor SW and the sensing transistor ST may turn on at the same time. In this case, a sensing operation through the sensing line VREF and a data output operation for outputting a data signal are distinguished based on the time-division method of the data driver 140.

A digital data signal, an analog data signal, or a gamma voltage may be compensated according to a sensing result. Also, a compensation circuit CC that generates a compensation signal (or compensation voltage) based on the sensing result may be implemented within the data driver 140, within the timing controller 120, or as a separate circuit.

The above-explained organic light-emitting displays do not require a backlight unit. Thus, their display panel 150 may be made thinner, compared to liquid crystal displays. Moreover, since the organic light-emitting display offers flexibility because of its thinness, the display panel 150 can be bent or curved, and therefore can be changed in shape, such as by rolling and unrolling it like a scroll. For this reason, more and more attempts are being made to design the display panel 150 of the organic light-emitting display and a mechanical structure for holding the display panel 150 in various shapes.

Now, the structure of a display panel 150 that can be rolled and unrolled like a scroll to realize a rollable flexible display will be described.

Figure 4:
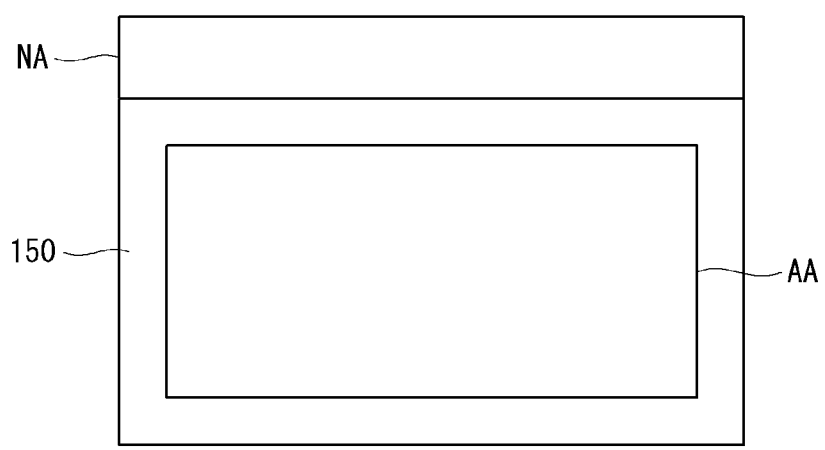
FIG. 4 illustrates the plane of a display panel according to an embodiment.
Figure 7:
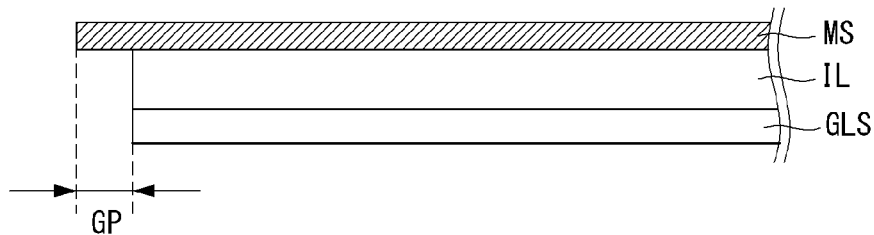
FIG. 7 is a cross-sectional view showing an example of joining a first substrate and a second substrate together according to an embodiment.
Figure 8:
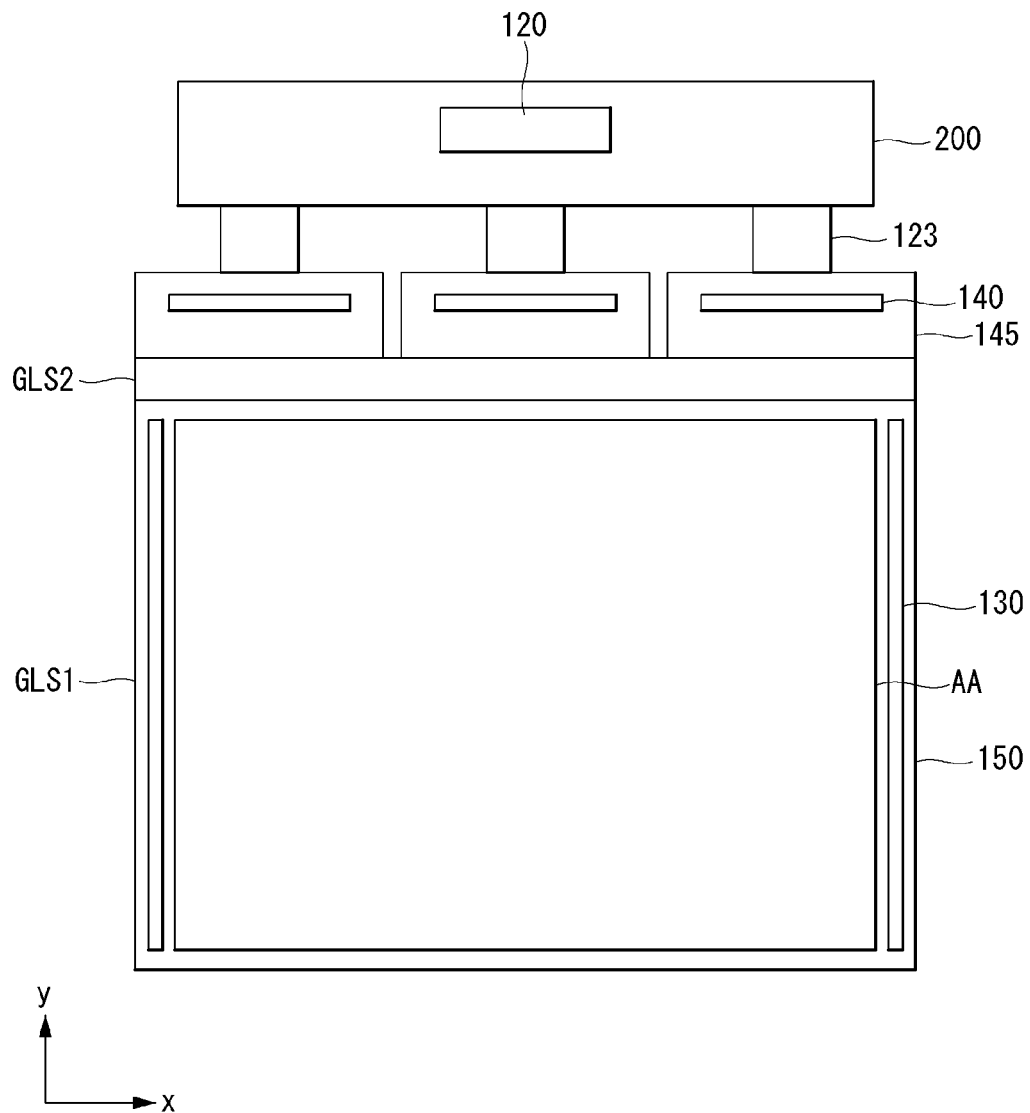
FIG. 8 is a plan view showing a display panel according to an embodiment.

FIG. 4 illustrates the plane of a display panel according to an embodiment. FIG. 5 illustrates a cross-section of a display panel according to an embodiment. FIG. 6 is a cross-sectional view showing an example of etching a first substrate according to an embodiment. FIG. 7 is a cross-sectional view showing an example of joining a first substrate and a second substrate together according to an embodiment. FIG. 8 is a plan view showing a display panel according to an embodiment.

As illustrated in FIGS. 4 through 8, the display panel 150 according to an embodiment comprises a first substrate GLS, an intermediate layer IL having a display area AA consisting of a plurality of pixels P, and a second substrate MS.

The intermediate layer IL has an adhesion layer ADL, along with the pixels P constituting the display area AA. The pixels P may be made up of subpixels that emit light of red (R), white (W), blue (B), and green (G), but are not limited to these colors of light. The adhesion layer ADL is made of an adhesive material that facilitates the joining of the first substrate GLS and the second substrate MS and seals the intermediate layer IL located between the first substrate GLS and the second substrate MS.

The first substrate GLS is made of glass or resin. The first substrate GLS may have a thickness of 0.01 mm to 0.2 mm. An experimental test result showed that, if the first substrate GLS is thin with a thickness of 0.01 mm to 0.1 mm, this makes it very easy to change the shape of the display panel 150 by rolling and unrolling it like a scroll.

The first substrate GLS has a first thickness portion including a display region in which an image is displayed and a second thickness portion thicker than the first thickness portion. The first substrate GLS has an etched region (or etched portion) GLS1 and an unetched region (or unetched portion) GLS2. The etched region corresponds to the first thickness portion, and the unetched region corresponds to the second thickness portion. The unetched region GLS2 is formed where a pad portion for connecting to an external substrate is formed. The unetched region GLS2 is in the shape of a rectangle which is horizontally long. The unetched region GLS2 is provided to increase the rigidity of the area connected to the external substrate. Due to this, the unetched region GLS2 may take up, e.g., 5 to 10% of the entire area of the first substrate GLS. Also, the thickness t2 of the unetched region GLS2 may range from 0.1 mm to 0.2 mm to maintain high rigidity compared to the etched region GLS1.

The rest of the first substrate GLS, except for the unetched region GLS2, is removed by an etching process and becomes the etched region GLS1. The etched region GLS1 is provided to mitigate the tensile stress that the first substrate GLS may be subjected to when the display panel 150 is rolled and unrolled like a scroll. Hence, the thickness t1 of the etched region GLS1 may range from 0.01 mm to 0.1 mm.

The second substrate MS is made of metal. The thickness of the second substrate MS may range from 0.01 mm to 0.2 mm. The second substrate MS serves to absorb, distribute, and mitigate the tensile stress that the first substrate GLS may be subjected to when the display panel 150 is rolled and unrolled like a scroll. An experimental test result showed that, if the second substrate MS is thin with a thickness of 0.01 mm to 0.2 mm, it is possible to efficiently absorb, distribute, and mitigate the tensile stress that the second substrate MS may be subjected to when the display panel 150 is rolled and unrolled like a scroll.

Since the second substrate MS is comprised of metal, the second substrate MS has better resistance to impacts compared to the first substrate GLS. Hence, the second substrate MS may be made larger than the first substrate GLS. That is, the second substrate MS may have at least one protruding part GP that protrudes outwards further than the first substrate GLS. The protruding part GP of the second substrate MS may serve to efficiently protect fragile parts like the corners from impacts the first substrate GLS may be subjected to.

As shown in FIG. 8, the display panel 150 is electrically connected and attached to the timing controller 120, data driver 140, scan driver 130, etc. (the image processor, a power supply part, etc. are not shown).

The scan driver 130 may be formed on the display panel 150 by GIP technology, the data driver 140 is mounted on a source substrate 145, and the timing controller 120 is mounted on a control board 200.

The scan driver 130 may be formed on the display panel 150 by GIP (Gate In Panel) technology on the left side, right side, or both the left and right sides of the display area AA so that the display panel 150 can be rolled like a scroll, in some embodiments. Moreover, the data driver 140 may be mounted on a source substrate 145 comprised of a flexible circuit substrate, and the timing controller 120 may be mounted on a control board 200 comprised of a printed circuit board, in some embodiments. Additionally, the source substrate 145 and the control board 200 may be connected by a cable 123.

The structure of a mechanical structure for realizing a rollable flexible display will now be described.

Figure 10:
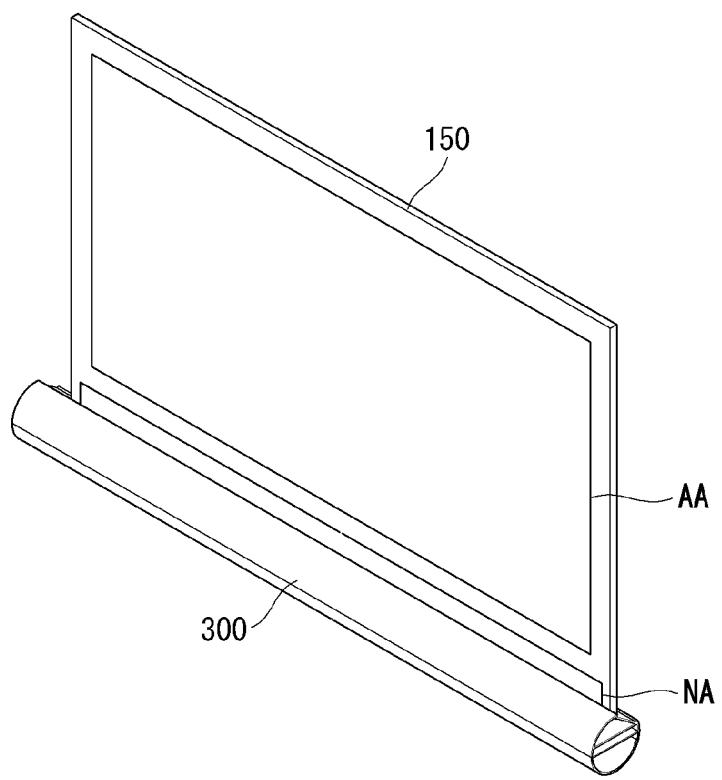
FIG. 10 is a perspective view showing a display panel and a panel roller portion according to an embodiment.

FIG. 9 is a view showing a rollable flexible display according to an embodiment. FIG. 10 is a perspective view showing a display panel and a panel roller portion according to an embodiment.

As illustrated in FIGS. 9 and 10, the rollable flexible display according to an embodiment comprises a display panel 150 (hereinafter, abbreviated as "display panel"), a panel roller portion 300, and a receptacle 170.

The panel roller portion 300 is cylindrical. The panel roller portion 300 provides a mechanical structure that allows the display panel 150 to be rolled up into a cylindrical shape around its circumference and unrolled from it. The panel roller portion 300 is contained in the receptacle 170.

The receptacle 170 holds the display panel 150 and the panel roller portion 300. A driving device (not shown in FIG. 9), such as a motor, a gear, a power source, etc. for electrically rotating the panel roller portion 300 may be included within the receptacle 170. As such, the receptacle 170 may be designed to be circular, elliptical, square, rectangular, or polygonal in shape according to the configuration or design of the driving device.

The display panel 150 comes out of the receptacle 170 or goes into the receptacle 170 depending on the direction of rotation of the driving device. For example, when the driving device rotates in the r1 direction, the panel roller portion 300 allows the display panel 150 to be unrolled. In this case, the display panel 150 moves in the y2 direction and therefore comes out of the receptacle 170. By contrast, when the driving device rotates in the r2 direction, the panel roller portion 300 allows the display panel 150 to be rolled. In this case, the display panel 150 moves in the y1 direction and therefore goes into the receptacle 170. (a) of FIG. 11 is a view of the display panel 150 when it comes out of the panel roller portion 300, and (b) of FIG. 11 is a view of the display panel 150 when it is rolling up on the inner space of the panel roller portion 300.

Figure 12:
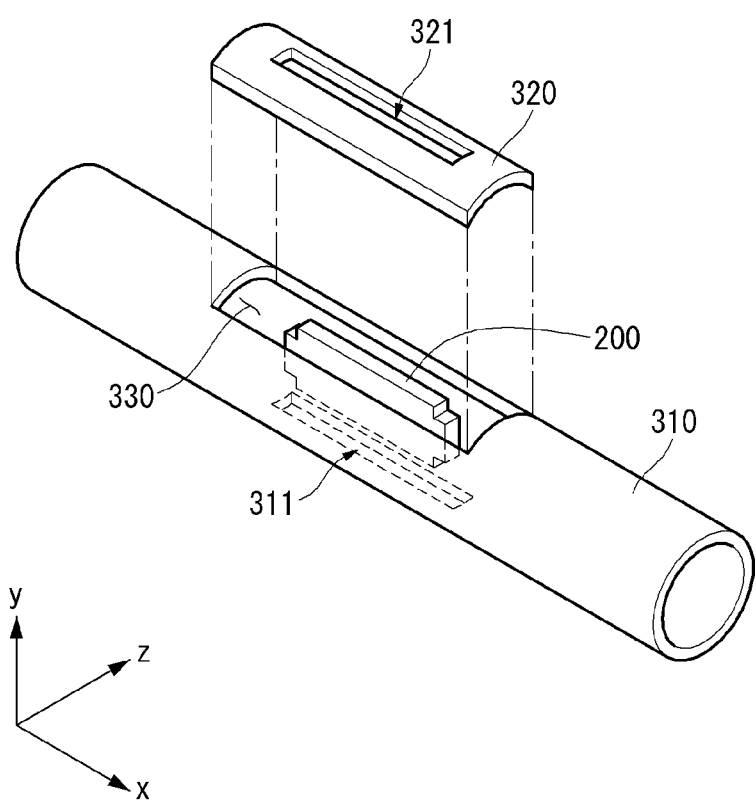
FIG. 12 is a perspective view of a control board inserted into the panel roller portion according to an embodiment.

FIG. 12 is a perspective view of the panel roller portion, case, and control board according to an embodiment. FIG.

Figure 14:
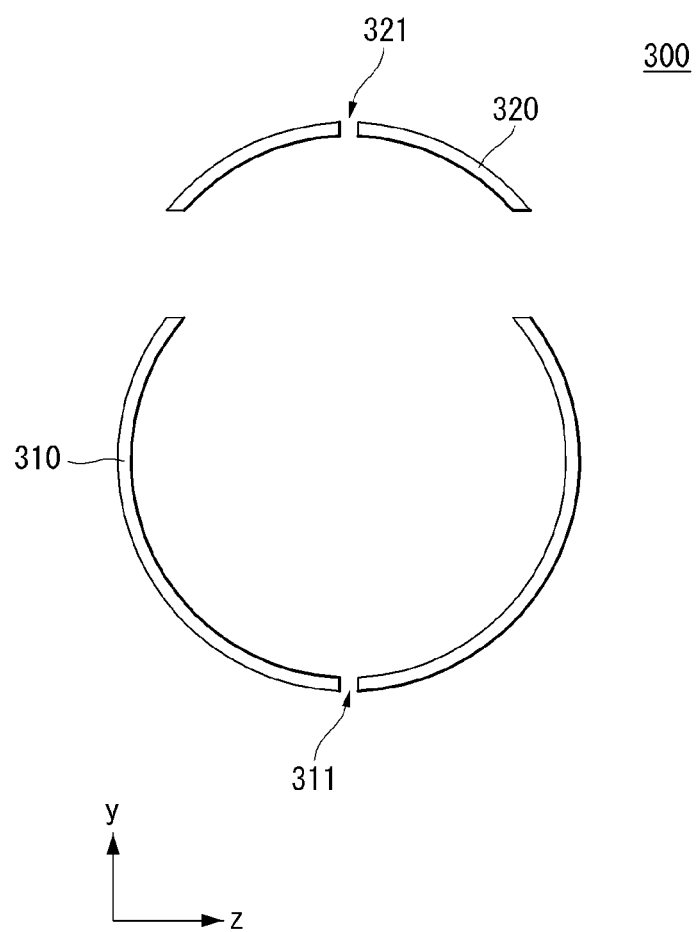
FIG. 14 is a view of the panel roller portion according an embodiment.
Figure 15:
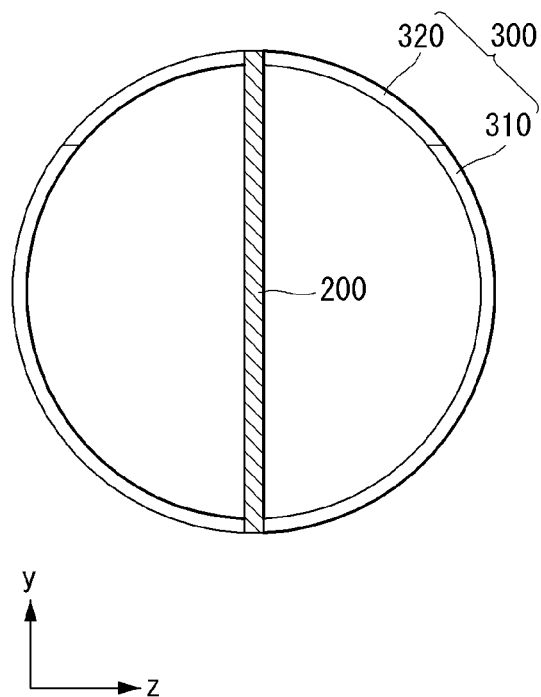
FIG. 15 is a cross-sectional view of the control board inserted into the panel roller portion according to an embodiment.
Figure 16:
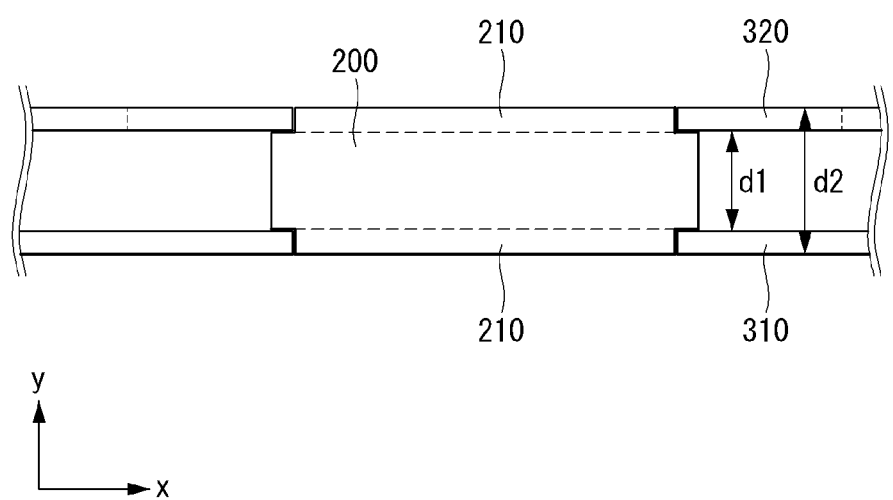
FIG. 16 is a cross-sectional view of the control board inserted into the panel roller portion according to an embodiment.

13 is a view of the control board 200 according to an embodiment. FIG. 14 is a view of the panel roller portion 300 according to an embodiment. FIGS. 15 and 16 are views of the control board 200 inserted into the panel roller portion 300 according to an embodiment.

Referring to FIGS. 12 to 16, the control board 200 and the panel roller portion 300 will be described below.

Referring to FIG. 12, the control board 200 according to an embodiment is mounted on the inner space of the panel roller portion 300. An insert portion 210 (shown in FIG. 13) of the control board 200 is inserted and fixed into first and second slots 311 and 321.

Figure 13:
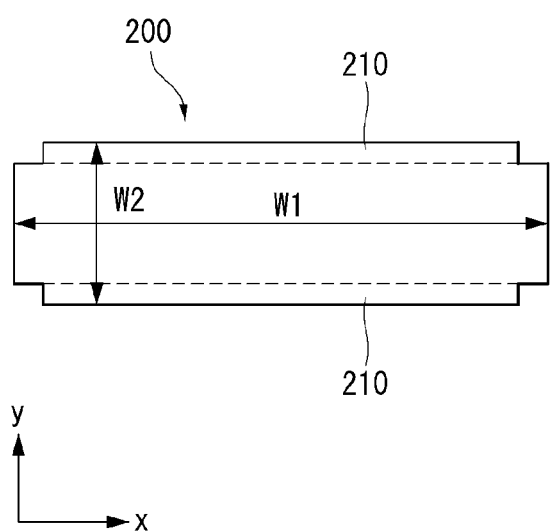
FIG. 13 is a view of the control board according to an embodiment.

Referring to FIG. 13, the control board 200 according to an embodiment comprises the insert portion 210. The insert portion 210 is a region that is inserted into the slots 311 and/or 321 formed on the side of the panel roller portion 300, and is provided on at least one edge of the control board 200. Although FIG. 13 illustrates a control board 200 with an insert portion 210 on each of two opposite edges, the insert portion 210 also may be formed on only one edge of the control board 200, in some embodiments. The insert portion 210 is formed on an edge parallel to the long axis (e.g., corresponding to the longitudinal width w1) of the control board 200, in order to reduce the diameter of the panel roller portion 300.

The longitudinal width w1 of the control board 200 as illustrated in FIG. 13 is greater than the length of the first and second slots 311 and 321, and therefore the control board 200 does not fall out through the first and second slots 311 and 321. The transverse width w2 of the control board 200 is greater than the inner diameter of the panel roller portion 300 and shorter than, or equal to, the outer diameter of the panel roller portion 300. If the corners of the control board 200 are stepped inward, the insert portion 210 may be defined as shorter than the longitudinal width of the control board 200. That is, the control board 200 may be designed in such a way that the corners become dummy regions in order for the control board 200 to have an insert portion 210, and the dummy regions on the corners may be cut out to form the insert portion 210.

Referring to FIG. 14, the panel roller portion 300 is cylindrical, and comprises a roller 310 and a case 320. The roller 310 is cylindrical, and has an aperture area 330 (shown in FIG. 12) at a part of a side. The first slot 311 is formed on a side of the roller 310, facing the aperture area 330. The first slot 311 may be shaped to expose the inner space of the roller 310 through the side of the roller 310.

The case 320 is a structure that covers the aperture area 330 of the roller 310, and the second slot 321 is formed in an area facing the first slot 311 (e.g., on opposite sides of the panel roller portion 300).

The insert portions 210 of the control board 200 are inserted into the first slot 311 of the roller 310 and the second slot 321 of the case 320. FIG. 15 is a view of a cross-section of the control board 200 inserted into the panel roller portion 300 when taken along the y-z plane, and FIG. 16 is a view of a cross-section of the control board 200 inserted into the panel roller portion 300 taken along the x-y plane.

That is, as illustrated in FIGS. 15 and 16, the control board 200 is mounted and fixed to the inner space of the panel roller portion 300, with the insert portions 210 inserted into the first and second slots 311 and 321.

In one embodiment, the control board 200 is inserted into the first and second slots 311 and 321 that are made through the exterior across the inner space of the panel roller portion 300, which can reduce the outer diameter d2 of the panel roller portion 300. That is, the outer diameter d2 of the panel roller portion 300 may be set equal to the transverse width w2 of the control board 200.

That is, embodiments of this invention can improve the portability of portable displays by reducing the size of the panel roller portion 300. Further, the space for holding the display panel 150 of a large-screen display can be reduced.

Figure 17:
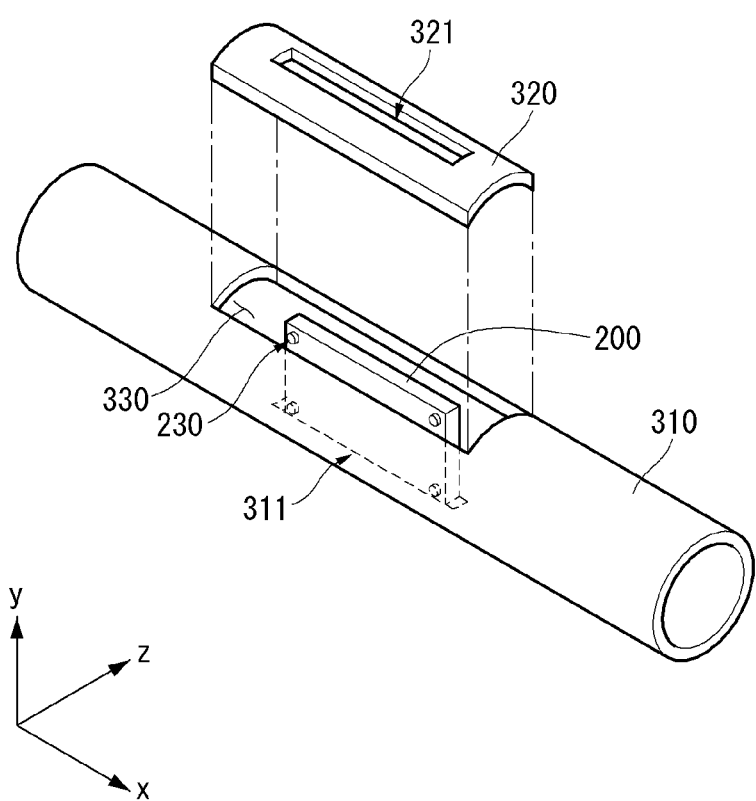
FIG. 17 is a perspective view of a control board inserted into the panel roller portion according to an embodiment.
Figure 19:
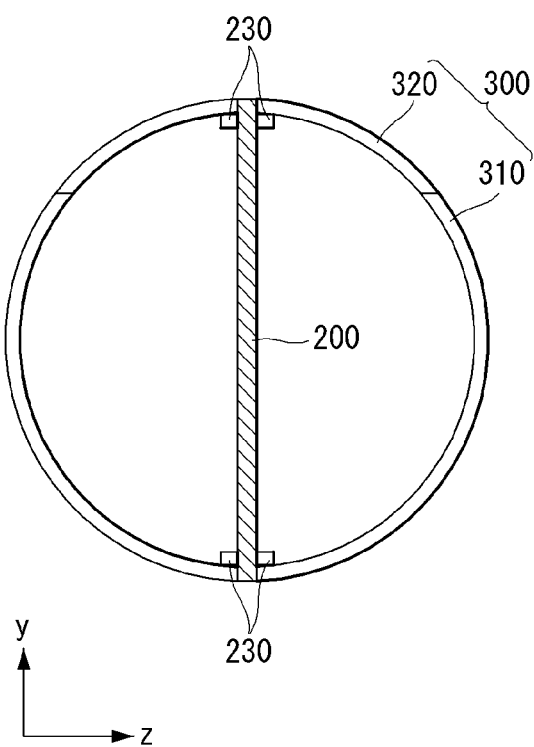
FIG. 19 is a cross-sectional view of the control board inserted into the panel roller portion according to an embodiment.

FIG. 17 is a perspective view of the panel roller portion 300, case 320, and control board 200 according to an embodiment. FIG. 18 is a view of the control board 200 according to an embodiment. FIG. 19 is a cross-sectional view of the control board 200 inserted into the panel roller portion 300 according to an embodiment.

Referring to FIGS. 17 to 19, the control board 200 and the panel roller portion 300 will be described below.

Referring to FIG. 17, the control board 200 according to an embodiment is mounted on the inner space of the panel roller portion 300. An insert portion 210 (shown in FIG. 18) of the control board 200 is inserted and fixed into first and second slots 311 and 321.

Referring to FIG. 17, the control board 200 according to an embodiment has protrusions 230. The protrusions 230 are provided on at least one of the front and rear sides of the control board 200 to prevent the control board 200, which is to be inserted into the first and second slots 311 and 321, from falling out from the panel roller portion 300. That is, the protrusions 230 define the insert portion 210 of the control board 200 according to an embodiment, and the insert portion 210 corresponds to an area between the edge of the control board 200 and the protrusions 230.

The panel roller portion 300 may have the same configuration as illustrated in FIG. 13.

As illustrated in FIG. 19, the control board 200 according to an embodiment may be fixed to the inner space of the panel roller portion 300, with the insert portions 210 inserted into the first and second slots 311 and 321.

Since the edge of the control board 200 according to an embodiment is inserted into the panel roller portion 300, the transverse width w2 of the control board 200 may be longer than the inner diameter d1 of the panel roller portion 300 and shorter than the outer diameter d2 of the panel roller portion 300. Thus, the overall outer diameter of the panel roller portion 300 can be reduced.

As discussed above, embodiments of the present invention can reduce the size of the panel roller portion 300 since the control board 200 is mounted on the inner space of the panel roller portion 300, around which the display panel 150 is rolled up, and the control board 200 is inserted into the slots in the panel roller portion 300.

From the above description, a person skilled in the art will appreciate that the invention may be embodied in other specific forms without changing the technical spirit or essential characteristics. In this regard, the embodiments described above should be understood to be illustrative rather than restrictive in every respect. The scope of the invention should be construed that the meaning and scope of the appended claims rather than the detailed description and all changes or variations derived from the equivalent concepts fall within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A rollable display device comprising:
a display panel having a display area and a non-display area including:
a scan driver configured to supply a scan signal to the display panel; and
a plurality of data drivers configured to supply a data signal to the display panel,
a panel roller portion; and
a control board in the panel roller portion,
wherein the scan driver is disposed on at least one side of the display area of the display panel and the plurality of data drivers are disposed along with a direction perpendicular to a rolling direction of the display panel,
wherein at least one edge of the control board contacts an inner surface of the panel roller portion.

2. The rollable display device of claim 1, wherein the control board is electrically connected to at least one of the plurality of data drivers and the scan driver via a connector.

3. The rollable display device of claim 2, wherein the connector is flexible cable.

4. The rollable display device of claim 1, wherein the scan driver is formed in a GIP structure in the non-display area of the display panel.

5. The rollable display device of claim 1, wherein the scan driver is formed in a GIP structure in the display area of the display panel.

6. The rollable display device of claim 1, wherein the scan driver is disposed on left and right sides of the display area of the display panel.

7. The rollable display device of claim 1, wherein the scan driver is disposed along with the rolling direction of the display panel.

8. The rollable display device of claim 1, wherein the at least one edge of the control board includes an insert portion and the panel roller portion includes a slot, the insert portion of the control board being coupled to the slot of the panel roller portion.

9. The rollable display device of claim 8, wherein the slot is made through an exterior across an inner space of the panel roller portion.

10. The rollable flexible display of claim 8, wherein the panel roller portion comprises:
a cylindrical roller having an aperture area;
a case covering the aperture area; and
another slot, wherein the slot is positioned to face the aperture area and the another slot is positioned on the case to face the slot.

11. The rollable flexible display of claim 8, wherein a longitudinal width of the control board is greater than a length of the slot, and wherein a longitudinal width of the insert portion is less than the longitudinal width of the control board.

12. The rollable flexible display of claim 11, wherein dummy regions on one or more corners of the control board are cut out so that the one or more corners are stepped inward.

13. The rollable flexible display of claim 8, wherein a longitudinal width of the control board is equal to or less than a length of the slot, and protrusions longer than a transverse width of the slot are included on at least one of a front and a rear side of the control board.

14. The rollable flexible display of claim 13, wherein a longitudinal width of the insert portion is equal to the longitudinal width of the control board.

15. The rollable display device of claim 1, wherein a transverse width of the control board is greater than an inner diameter of the panel roller portion.

16. The rollable display device of claim 1, wherein the subpixel includes a switching transistor, a drive transistor, a capacitor, a compensation circuit, and an organic light emitting diode (OLED).

17. The rollable flexible display of claim 1, wherein the display panel includes a first substrate and second substrate coupled to a surface of the first substrate,
wherein the second substrate is larger than the first substrate such that the second substrate protrudes outward further than the first substrate.

18. The rollable flexible display of claim 17, wherein the first substrate includes a first thickness portion including a display region and a second thickness portion thicker than the first thickness portion.

* * * * *